United States Patent

[11] 3,628,058

[72] Inventor Roy H. Espe
Lombard, Ill.
[21] Appl. No. 13,390
[22] Filed Feb. 24, 1970
[45] Patented Dec. 14, 1971
[73] Assignee Motorola, Inc.
Franklin Park, Ill.

[54] INTEGRATED DUAL TIME CONSTANT SQUELCH CIRCUIT
16 Claims, 2 Drawing Figs.

[52] U.S. Cl. ........................................................ 307/235,
325/478, 328/151, 328/167
[51] Int. Cl. ........................................................ H03k 5/20,
H04b 1/10
[50] Field of Search ........................................... 307/235,
233; 328/58, 138, 140, 151, 167; 325/348, 477, 478

[56] References Cited

UNITED STATES PATENTS 3,126,449 3/1964 Shirman ....................... 325/477 X
3,325,738 6/1967 Busby et al. .................. 325/477
3,470,482 9/1969 Kolnowski ..................... 328/58 X

*Primary Examiner*—Donald D. Forrer
*Assistant Examiner*—John Zazworsky
*Attorney*—Mueller & Aichele

ABSTRACT: An integrated circuit dual time constant squelch circuit for eliminating squelch tail includes a short time constant ripple filter which produces a filtered noise voltage which is applied to the inputs three differential switch circuits actuated at three different threshold levels. The differential switch with the lowest threshold level establishes the minimum detected noise voltage to which the circuit responds and, upon actuation, charges a long time constant storage capacitor to a value exceeding a second threshold of a second of the differential switch circuits used as an output switch and having the capacitor connected to a second input thereof. The third differential switch circuit is actuated when a third, higher, threshold level is exceeded by the detected noise voltage and operates to disable the output of the second differential switch at strong signal levels, thereby switching control of the circuit solely to the short time constant ripple filter.

Patented Dec. 14, 1971 3,628,058

2 Sheets-Sheet 1

INVENTOR
ROY H. ESPE
BY Mueller, Aichele & Rauner
ATTORNEYS.

Patented Dec. 14, 1971 3,628,058

2 Sheets-Sheet 2

INVENTOR
ROY H. ESPE

BY Mueller, Aichele & Rauner
ATTORNEYS.

INTEGRATED DUAL TIME CONSTANT SQUELCH CIRCUIT

BACKGROUND OF THE INVENTION

Dual time constant squelch circuits responsive to detected receiver noise are known and used in communications receivers for eliminating noise output from the audio section during periods when no signal is received. Such circuits operate to keep the squelch open during weak signal fade and flutter but eliminate squelch tail when stronger transmission terminates. Reference is made to copending application Ser. No. 643,874, filed June 6, 1967 by James R. Glasser and Stanley J. Tomsa, now abandoned, and continuation application Ser. No. 28,169, filed Apr. 13, 1970, entitled SQUELCH CIRCUIT HAVING SHORT AND LONG TIME CONSTANT FILTERS FOR SQUELCH TAIL ELIMINATION; and to copending application Ser. No 850,447, filed Aug. 15, 1969 by George M. Hanus and Alfred R. Lucus, entitled SQUELCH CIRCUIT WITH SQUELCH TAIL ELIMINATION, now U.S. Pat. No. 3,596,184; which describe squelch circuits having such characteristics.

To provide for best weak signal flutter performance, the squelch control should be obtained from a filter having a relatively long time constant, with this filter being rendered ineffective at high signal levels when a short time constant filter controls the squelch operation. For weak signal levels just over the threshold for operating the squelch circuit, the maximum time constant output should exist for best flutter and fade protection. Most squelch circuits, both single and dual time constant, however, rely at least in part on the strength of the input signal to determine the time constant of the filter circuit; so that even through the long time constant circuit is effective for minimum or threshold signals, the time constant provided at or near threshold is shorter than that provided by the same circuit at higher levels close to the level where it is rendered ineffective with squelch control being switched to the short time constant filer. This is the reverse of the desired situation.

SUMMARY OF THE INVENTION

Accordingly, it is an object of this invention to provide an improved dual time constant squelch circuit.

It is an additional object of this invention to provide a dual time constant squelch circuit in which the longer of the two time constants is the same throughout the range of its effectiveness irrespective of the input signal strength within that range.

It is a further object of this invention to improve the operation of a squelch circuit for a receiver for eliminating "squelch tails" at low signal levels.

In accordance with a preferred embodiment of this invention, a dual time constant squelch circuit includes a short time constant filter circuit responsive to the detected noise voltage providing a filtered noise voltage to the inputs of each of three switch circuits having first, second and third thresholds, respectively and being actuated whenever the input voltage exceeds the threshold thereof, the second threshold being higher than the first and the third threshold being equal to or higher than the second. Actuation of the first switch circuit charges a long time constant storage means to the same level whenever the first switch circuit is actuated. The output of the charge storage means then is applied to the input of the second switch circuit and exceeds the threshold thereof to operate the second switch circuit.

As the detected noise voltage exceeds the second threshold, it becomes sufficient to operate the second switch circuit in and of itself; and when the detected noise voltage increases to a point where it exceeds the third threshold voltage for the third switch circuit, an output is produced from the third switch circuit to disable the input to the charge storage means. Control of the second switch circuit then is solely effected by the short time constant noise filter.

DETAILED DESCRIPTION

Figure 1:
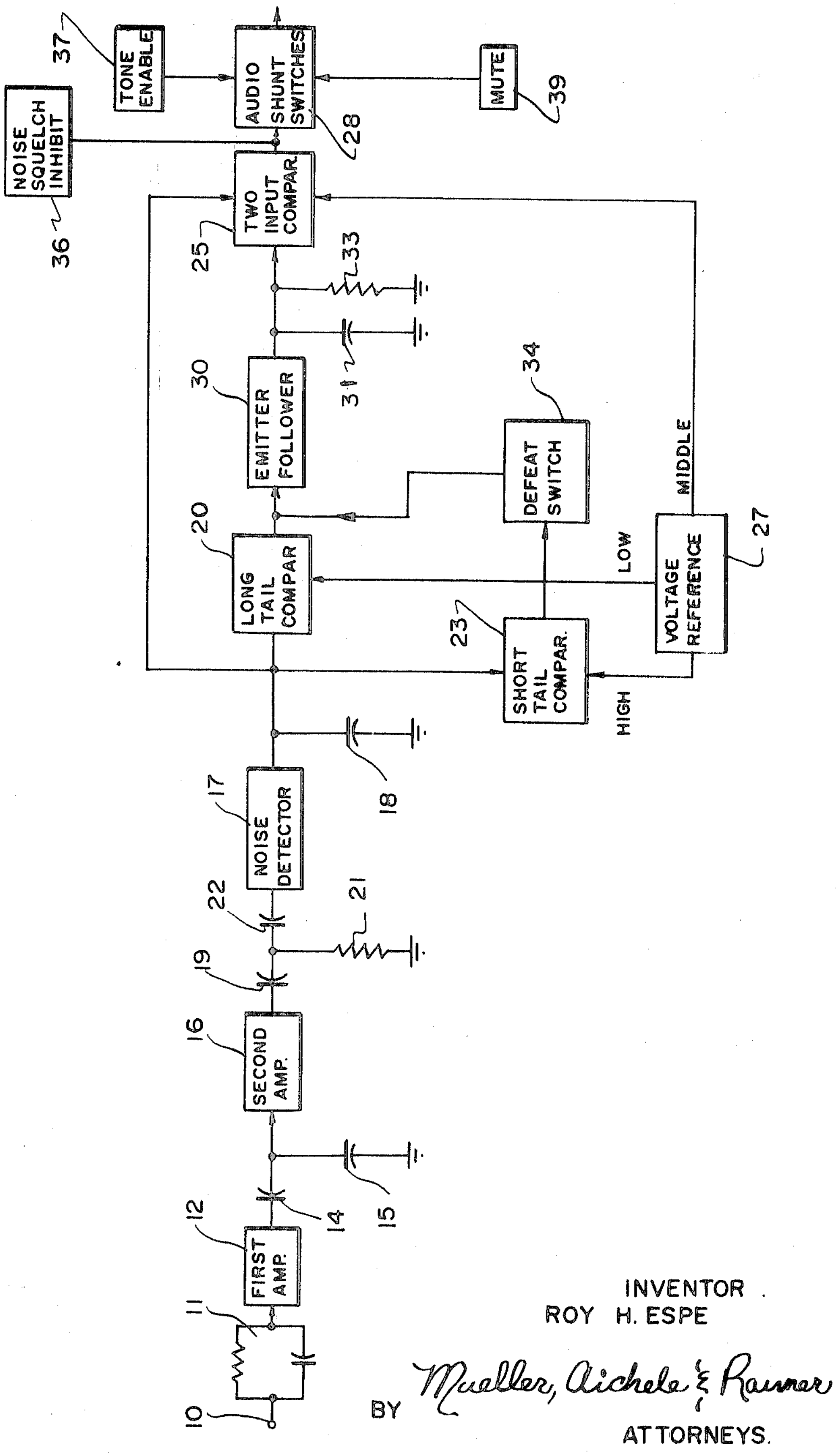
FIG. 1 is a block diagram of a preferred form of the invention.

Referring now to FIG. 1 there is shown a block diagram of a squelch circuits in accordance with a preferred embodiment of this invention. Signals from the output of the discriminator of a radio receiver (not shown) are applied on an input terminal 10 to a frequency shaping circuit 11 which selects the frequency band sampled and provides the signals to the input of a first amplifier 12. The shaping circuit 11 sets the ratio of the audio to noise voltage driving the first amplifier 12 and causes the amplifier 12 to be driven to limiting by the audio signals to eliminate blocking. The amplified noise output signals from the first amplifier 12 are AC coupled by capacitors 14 and 15 to a second amplifier 16, which provides additional gain for the noise signal to be processed by the squelch filter circuit.

The second amplifier 16 is coupled to a noise detector circuit 17 through a high-pass filter circuit including a capacitor 19 and the parallel combination of a resistor 21 and the input impedance of the detector 17, with a charge accumulating capacitor 22 providing for a voltage doubling action of the noise detector circuit 17. The value of the resistor 21 is chosen to swamp the input impedance of the detector circuit 17 to thereby reduce variations in the input impedance of the detector, rendering it less sensitive to device variations.

The detected noise voltage at the output of the noise detector circuit 17 increases with received signal strength and is coupled to a short time constant noise filter in the form of a capacitor 18, with the filter operating to reduce the ripple of the detected noise voltage. This filtered noise voltage is applied to the inputs of three comparator circuits in the form of a long tail comparator circuit 20, a short tail comparator circuit 23, and a two input comparator circuit 25. The comparator circuits 20, 23, and 25 are switched or actuated at three different voltage levels as determined by a voltage reference circuit 27, which supplies the lowest threshold or reference voltage to the comparator circuit 20, a middle voltage to the circuit 25 and the highest reference voltage to the short tail comparator circuit 23. The output of the two input comparator circuit 25 operates an audio shunt switch 28 to effect the squelching of the receiver.

When the detected noise voltage present on the capacitor 18 exceeds the threshold voltage of the long tail comparator circuit 20, the comparator 20 is actuated and drives an emitter follower circuit 30 into conduction to charge a charge storage capacitor 31 to a predetermined fixed voltage level. Any time the threshold of the long tail comparator circuit 20 is exceeded by the voltage present on the noise filter 18, the capacitor 31 is charged to the same voltage level, irrespective of the signal strength, once the minimum threshold for the signal strength has been exceeded. The discharge path for the capacitor 31 is through a resistor 33 providing a long time constant for such discharge.

The voltage stored on the capacitor 31 is applied to a second input of the two input comparator circuit 25 and exceeds the threshold provided by the reference voltage circuit to cause an output to be obtained from the two input comparator circuit 25 whenever the capacitor 31 is charged. This output causes the audio shunt switch 28 to be disabled to permit reproduction of the audio signals being processed by the receiver.

When a third or highest threshold voltage is exceeded by the filtered noise voltage on the short time constant filter capacitor 18, the short tail comparator circuit 23 provides an output to a defeat switch 34 which disables to renders nonconductive the emitter follower 30. The capacitor 31 then commences discharging through the resistor 33, but the two input comparator circuit 25 remains actuated because of the voltage present on the other of its two inputs from the filtered noise voltage capacitor 18.

If the signal now rapidly drops, the capacitor 18 is rapidly discharged by the detector 17; and sine the capacitor 31 is discharged, the output of the switch 25 rapidly drops. The audio shunt switch 28 rapidly shunts the audio signals in the receiver and squelch tail is eliminated.

If, however, the detected noise voltage drops slowly, the defeat switch 34 is disabled when the detected noise voltage drops below the threshold of the comparator 23. The emitter follower circuit 30 then again is enabled and rapidly charges the capacitor 31 to its former value, so that the comparator circuit 25 remains actuated under control of the long time constant circuit 31 and 33 for slow reductions in signal strength of the type which could be caused by flutter and fade. For weak signal conditions, it is apparent that the long time constant circuit 31 and 33 dominates, with the short time constant circuit defeating operation of the long time constant circuit for strong signal levels.

When the circuit shown in FIG. 1 is utilized in conjunction with a tone-coded selective-calling receiver, it may be desirable to provide additional control of the audio shunt switch 28 in addition to or in place of the remainder of the circuit shown in FIG. 1. To accomplish this, a noise squelch inhibit circuit 36 operating in conjunction with tone enable circuit 37 may be provided to override or supplement the effects of the output of the comparator switch 25 in response to the operation of the tone-coded squelch circuit of the receiver.

When the receiver is used as part of a two-way radio station, it further is desirable to mute the audio stages of the receiver whenever transmission from the station takes place. This may be effected by causing the audio shunt switch 28 to shunt the receiver audio stages in response to application of a signal through a mute input 39, which may be operated when the "-push-to-talk" switch in the transmitter is operated.

Figure 2:
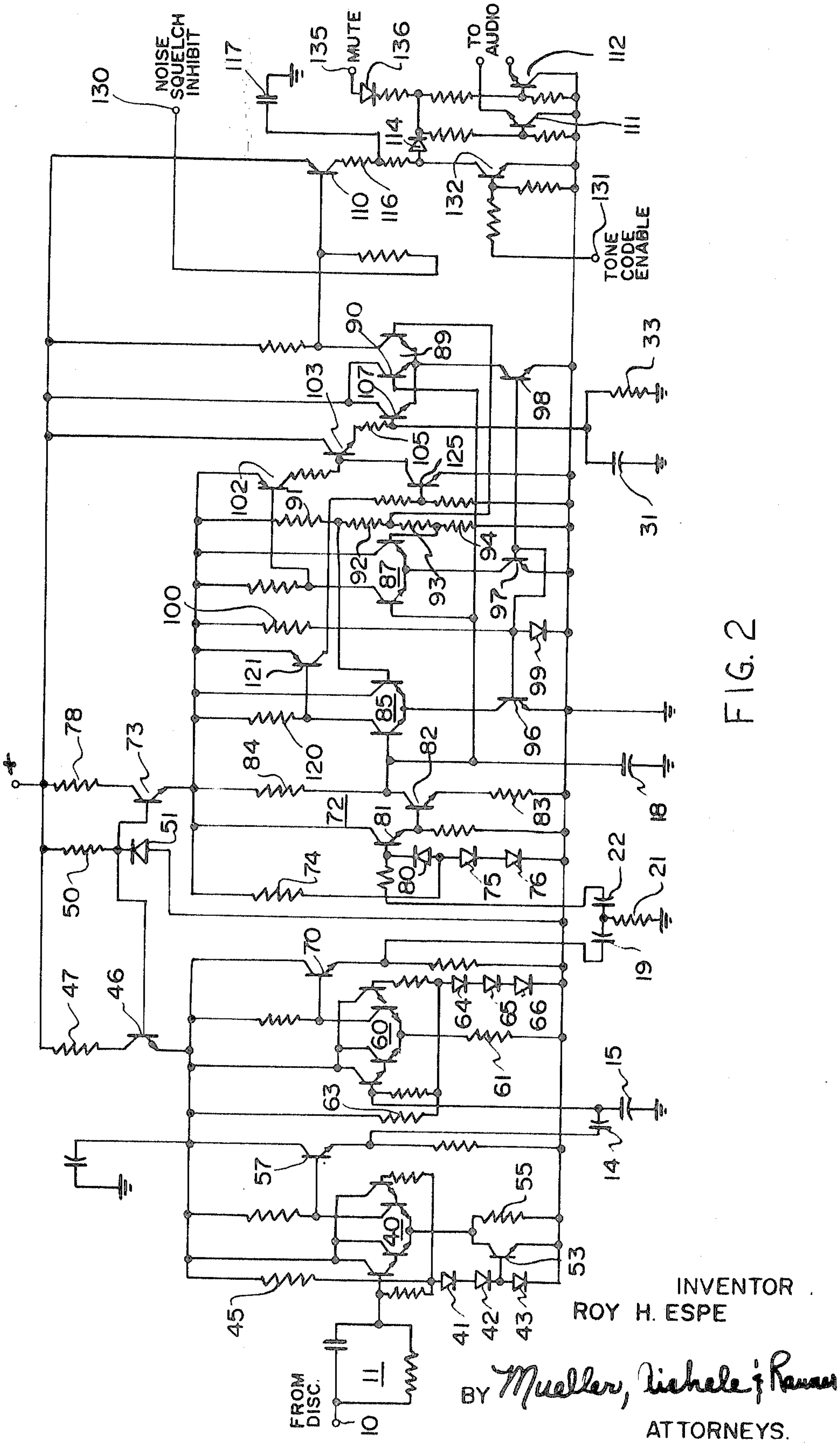
FIG. 2 is a detailed schematic diagram of a preferred form of the invention.

Referring now to FIG. 2, there is shown a detailed schematic diagram of the noise detection and squelch circuit shown in block diagram form in FIG. 1, with the circuit shown in FIG. 2 being formed on a single silicon semiconductor integrated circuit chip, with the exception of the reactive components.

In the circuit shown in FIg. 2, the signals from the radio receiver discriminator are applied to the input terminal 10 and through the signal input shaping network 11 to a first amplifier stage which is in the form of a Darlington differential amplifier 40. A reference or operating potential for the amplifier 40 is obtained from the voltage drop across three diodes 41, 42, and 43 which are in the form of NPN-transistors with collectors shorted to their bases. These diodes form a part of a voltage divider, including a further resistor 45, coupled to the emitter of an emitter-follower regulator transistor 46, the collector of which is connected through a collector impedance 47 to a source of positive potential. To establish the operating potential applied to the differential amplifier 40 from the voltage divider 41, 42, 43 and 45, the base of the regulator transistor 46 is coupled to a further voltage divider including a resistor 50 and a Zener diode 51 connected between the source of positive potential and ground, with the voltage drop across the Zener diode 51 establishing the operating point of the transistor 46.

Even though the operating voltage obtained from the emitter of the transistor 46 is regulated by virtue of the voltage drop across the Zener diode 51, the operating point of the differential amplifier 40 does exhibit variations with temperature because of the temperature coefficients of the resistors and diodes formed as part of the integrated circuit chip. In order to compensate for the temperature variations, which otherwise would cause variations in the gain of the differential amplifier 40, two current sources for the amplifier 40 are employed. One current source is the collector current of an NPN-current source transistor 53, biased in conventional fashion by the transistor diode 43, with the other current source being in the form of a resistor 55 which is connected in parallel with the collector-emitter path of the transistor 53. These two current sources exhibit opposite temperature coefficients; and by proper adjustments of the values of the resistor 45 and the resistor 55, it is possible to obtain a range of temperature coefficients for the operating current for the amplifier 40 between the two extremes provided by the current sources. For the purposes of illustration of the operation of this circuit shown in FIG. 2, the temperature coefficient of the first amplifier stage 40 is chosen to be almost zero.

The output of the amplifier 40 is coupled through an NPN-emitter follower transistor 57 and a band-pass circuit including the capacitors 14 and 15 to the input of a second Darlington differential amplifier 60. This second amplifier 60 is similar to the amplifier 40, except that only a single current source in the form of a resistor 61 is used to cause the amplifier 61 to have a negative temperature coefficient of gain. The operating potential for the amplifier 60 is obtained from a voltage divider including a resistor 63 and three transistors diodes 64, 65 and 66 connected between the emitter of the regulator transistor 46 and ground. In all other respects, the operation of the differential amplifier 60 is the same as the operation of the amplifier 40 to provide additional gain for the noise signal being processed by the circuit.

The output of the differential amplifier 60 is applied through an emitter follower transistor 70 and the coupling circuit 19, 22 and 21, previously described, to the input of a noise detector stage 72. It should be noted that the emitter followers 57 and 70 are provided to buffer the outputs of the respective amplifier stages 40 and 60 to minimize the loading effects of the following circuitry on the stage gains.

The noise detector 72 is a peak-to-peak amplifying detector with operating potential being obtained from the emitter of a second emitter follower, regulator transistor 73, which is provided with an operating point by the voltage drop across the Zener diode 51, as is the emitter follower transistor 46. The emitter of the regulator 73 is coupled through a voltage divider, including a resistor 74 and two transistor diodes 75 and 76 to ground; and the collector of the transistor 73 is coupled through a collector resistance 78 to the source of positive potential. The collector resistors 47 and 78 limit the maximum current drain of the regulator circuits in the event of an accident short circuit external to the integrated circuit chip.

The NPN-emitter follower, regulator transistor 46 provides the operating potential for the differential amplifiers 40 and 60, with the regulator transistor 73 providing the operating potential for the noise detector 72 and the squelch switching circuits on the chip. By utilizing two separate regulators, the amplifier stages are isolated from the transient producing switch circuits; and the regulators themselves both operate to decouple these same stages of the circuit from external supply variations and noise.

DC biasing potential for the detector stage 72 is obtained from the voltage drop across the transistor diodes 75 and 76 and is applied through another transistor diode 80 and the base of an NPN-transistor 81, which is an emitter follower driving an amplifying detector transistor 82, the emitter of which is connected through a resistor 83 to ground. The collector of the transistor 82 is connected through a load resistor 84 to the emitter of the NPN-regulator transistor 73, and this point further is connected to the noise filter capacitor 18.

As stated previously, the capacitor 18 is used to store the detected noise voltage; and the charge accumulated by the capacitor 18 is a direct function of the signal strength (inverse to noise), the charge being at its lowest level with no signal and increasing in the positive direction with increasing signal strength (decreasing noise). This voltage stored by the capacitor 18 then is utilized to operate the squelch circuitry in the receiver. The time constant of the detected noise voltage filter capacitor 18 is a short time constant; so that upon termination of a signal or a signal drop on the collector of the transistor 82, the capacitor 18 is rapidly discharged by the detector transistor 82.

It should be noted that the two diode voltage drop across the diodes 75 and 76 is insufficient to forward bias the transistors 81 and 82 into conduction, due to the inclusion of the transistor diode 80 in the series path with the base-emitter junctions of the transistors 81 and 82. The diodes 75 and 76, however, provide a standby bias which biases the transistors 81 and 82 very near conduction in order to obtain a high detection sensitivity.

By causing the value of the resistor 21 to be less than the input impedance of the detector stage 72, input impedance variations of the detector circuit 72 are swamped out by the resistor 21 so that they have reduced effect on the frequency shaping determined by the capacitor 19 and the resistor 21.

It should be noted that the forward voltage drops across the diode 80 and the base-emitter junctions of the transistors 81 and 82 subtract from the input noise voltage applied to the detector 72. The changes of these voltages with temperature and the shift in the filter output of the detector that would result in a change in the voltage stored by the capacitor 18 are compensated for by varying the drive to the detector with temperature. This is the reason that a negative temperature coefficient, provided by the current source resistor 61, is employed for the differential amplifier 60. The output of the detector is permitted to change with temperature only by an amount sufficient to track the corresponding changes of the reference voltages applied to the squelch switching circuit in the remaining portion of the circuit shown in FIG. 2 because of changes in the regulated voltage.

The turn-on and turnoff times for the detector circuit 72 are controlled by the values of the capacitors 22 and 18, and these capacitors values are made as small as possible to maintain a fast-attack and fast-decay. As stated previously, the output of the noise detector circuit 72, in the form of the DC voltage developed across the short time constant, ripple filter capacitor 18, is a direct function of signal strength. This output is applied to three comparator circuits in the form of differential amplifiers, or differential switches 85, 87 and 89, with the differential amplifier 87 corresponding to the long tail comparator circuit, the differential amplifier 89 corresponding to the two input comparator circuit, and the differential amplifier 85 corresponding to the short tail comparator circuit shown in FIG. 1.

Each of the differential amplifier switch comparator circuits 85, 87 and 89 compares the detected noise voltage present on the capacitor 18 with a reference voltage supplied to the comparator circuits from a voltage divider string, including resistors 91, 92, 93 and 94, connected between the emitter of the regulator transistor 73 and ground. The lowest reference voltage is applied to the comparator 87, a middle reference voltage is applied to the comparator 89, and the highest reference voltage is applied to the comparator 85. Operating current for the three comparator circuits 85, 87 and 89 is obtained from three corresponding current source transistors 96, 97 and 98, with the operating level for each of these transistors being obtained across a single current reference diode 99, connected as part of a voltage divider, also including a resistor 100, connected between the emitter of the transistor 73 and ground. As a consequence, the operating current for each of the three comparator circuits 85, 87 and 89 is substantially the same.

When the detected noise input voltage obtained from the capacitor 18 applied to the input transistor of the comparator circuit 87 is lower than the reference voltage obtained from the junction between the resistors 93 and 94 the operating current of the differential amplifier comparator switch 87 flows through the referenced transistor. The collector of the input transistor of the amplifier 87 then is at a positive potential, back-biasing a PNP-lateral transistor 102 connected thereto to a state of nonconduction, causing an NPN-emitter follower transistor 103 connected to the collector of the transistor 102 to also be biased to a state of nonconduction.

As the detected noise input voltage increases, a point is reached where the state of operation of the comparator 87 changes or switches, so that the input transistor is rendered conductive. This may be considered actuation of the comparator amplifier switch 85. The current initially is split between the two transistors of the comparator, the highest percentage of the current flowing through whichever one of the transistors has the highest base voltage. Current flowing through the collector of the input transistor of the comparator circuit 87 then causes the PNP-transistor 102 to be rendered conductive, which in turn causes the emitter follower transistor 103 to conduct to commence charging the long time constant capacitor 31 through a charging resistor 105.

Further increases in the input voltage causes the comparator 87 to completely switch, so that all of the current is drawn by the left-hand or input transistor with the right-hand or referenced transistor being rendered nonconductive. The high transconductance of the comparator 87 and collector load resistance of the transistor 102 provide a steeply sloped output voltage, so that the operation of the comparator circuit 87 is almost like that of a switch. Further, it should be noted that the current gain provided by the comparator circuit 87 results in very light loading on the output of the noise detector 72.

When the capacitor 31 in the long time constant circuit is rapidly charged through the relatively low value charging resistor 105 by conduction of the emitter follower transistor 103, the capacitor 31 is charged substantially to the full regulated supply obtained from the emitter of the transistor 73 less the base-emitter voltage drop of the transistor 103 and the saturation voltage of the transistor 102. It should be noted that as soon as the threshold or reference voltage of the comparator circuit 87 is exceeded, the capacitor 31 is charged to the same potential, irrespective of the amount of voltage in excess of the reference level which is applied to the input of the comparator circuit 87 from the short time constant filter capacitor 18. As a consequence, the charge on the capacitor 31 is not dependent on the detected noise signal strength, except that the signal strength must exceed the threshold established by the reference voltage at the junction of the resistors 93 and 94 before the capacitor 31 is charged.

To prevent the charging current for the capacitor 31 and other switching transients occurring in the remainder of the circuit from affecting the portions of the circuit which have been described, the collector of the emitter follower transistor 103 and the collectors of the transistors in the comparator circuit 89, along with the other transistors to be described, are provided with positive potential directly from the B+ supply. Thus, these stages are isolated from the supply obtained from the regulator 73 and applied to the detector circuit 72 and the comparator circuits 85 and 87.

When the transistor 103 is rendered conductive and when a charge is stored on the capacitor 31, an input transistor 107 forming one of the two inputs for the comparator 89 is rendered conductive, causing the comparator circuit 89 to be switched or actuated in a manner similar to the switching or actuation of the comparator circuit 87. When this occurs, the potential on the collector of the referenced transistor of the comparator 89 rises to a positive potential, since this transistor is rendered nonconductive. This positive potential in turn is applied to the base of an PNP-lateral transistor 110, rendering it nonconductive to remove the forward biasing voltage supply from a pair of audio shunt switches in the form of NPN-transistors 111 and 112. The transistors 111 and 112 become nonconductive, thereby unsquelching the receiver to permit the reproduction of signals received thereby in the audio output of the receiver.

If the signal now is removed, the capacitor 18 is rapidly discharged by the detector transistor 82, and the long tail comparator circuit 87 switches to its original state turning off or rendering nonconductive the emitter follower transistor 103 since the transistor 102 is rendered nonconductive. The capacitor 31 then discharges slowly through the resistor 33 which establishes a long time constant for the discharge of the capacitor 31. When the voltage across the capacitor 31 passes below the reference voltage applied to the referenced transistor of the two input comparator circuit 89, the transistor 107 becomes nonconductive, with the referenced transistor of the comparator circuit being rendered conductive. This, in turn, causes the PNP-transistor 110 to be rendered conductive to apply a positive potential through an isolating diode 114 to the bases of the NPN-transistors 111 and 112, rendering these transistors conductive to shunt the audio output of the receiver, thereby squelching the receiver.

This operation is for low-input signal strengths as detected by the detector circuits 72 and provided across the capacitor 18. The squelch tail provided, that is, the time required to switch the comparator circuit 89 back to its original state, is always of the same length because of the characteristics of the long tail comparator circuit 87 since the capacitor 31 is always charged to the same voltage once actuation of the comparator circuit 87 commences. A resistor 116 coupled in series with the collector of the PNP-transistor 110 and a capacitor 117, connected to ground at one end and to the resistor 116 at the other end, are provided to limit the rate at which the shunt switches 111 and 112 are turned on in order to "soften" the squelching action. Without these circuit components, the abrupt squelching action would be annoying especially when the signal is right at the squelch threshold of the receiver.

It further should be noted that the NPN-transistors 111 and 112 are inverted from the normal connections in the circuit, inasmuch as the collectors of these transistors are connected to ground, with the emitters being connected to the audio circuits of the receiver. Since the doping of the collector of a transistor is less than that of the emitter, less DC offset occurs if the base-collector junction is forward biased. This results in less switching noise from the transistors 111 and 112.

If the detected signal strength continues to increase past the point where the receiver circuit is first unsquelched by the operation of the comparator circuit 87 until the detected noise voltage applied to the second input transistor 90 of the comparator circuit 89 exceeds the reference voltage of the comparator 89, nothing further happens; because the transistor 107 already has been rendered conductive by the higher voltage obtained from the emitter of the transistor 103.

As signal strength is further increased, however, until the voltage at the base of the input transistor of the short tail comparator 85 exceeds the reference voltage applied to the reference transistor of the comparator 85, the input transistor of the comparator 85 is rendered conductive with the referenced transistor being rendered nonconductive. When the input transistor of the comparator 85 conducts, the potential drop across the collector resistor 120 results in the application of a forward biasing potential to the base of the PNP lateral transistor 121, causing the transistor 121 to conduct. This, in turn, forward biases an NPN-transistor defeat switch 125, the collector of which is connected to the base of the NPN-emitter follower transistor 103 and the emitter of which is connected to ground. When the transistor 125 connects, the base voltage on the transistor 103 drops below the reference of the two input comparator circuit 89 therefore turning off or rendering nonconductive the transistor 103, allowing the discharge of the capacitor 31 rendering the transistor 107 nonconductive; but the transistor 90 is conductive at this time so that no change in the output state of the operation of the comparator 89 takes place. Thus, the audio shunt transistors 111 and 112 remain nonconductive.

If the input signal now terminates, the capacitor 18 rapidly discharges, as described previously, and the transistor 90 is rendered nonconductive, with the referenced transistor of the comparator circuit 89 then becoming conductive. This causes the turning on of the audio shunt transistors 111 and 112 through the conduction of the PNP-transistor 112 to rapidly squelch the receiver. It should be noted also that when the potential on the emitter of the transistor 103 drops to near ground potential because of conduction of the defeat transistor 125, the long time storage capacitor 31 also is discharged.

As the capacitor 18 is discharged the short tail comparator 85 also switches back to its original state and turns off the transistor 121, which in turn causes the transistor 125 to be turned off. When this occurs, the capacitor 31 commences to charge through the then conductive emitter follower transistor 103. The resistor 105, however, limits the charging rate such that the voltage across the capacitor 31 does not reach the two input comparator reference voltage before the detected noise voltage drops enough to switch the long tail comparator circuit 87 back to its original state of operation, with the input transistor nonconductive and the referenced transistor conductive and stops the changing of the capacitor 31.

If the input signal decreases at a slower rate, such as during the flutter or fade, the capacitor 31 is charged above the reference level of the two input comparator circuit 89 before the transistor 90 is rendered nonconductive. This permits the transistor 107 to be rendered conductive without a change of state of the comparator 89, but reverting the circuit to the long squelch tail mode of operation under the control of long time constant circuit including the capacitor 31 and the resistor 33.

It is apparent from the foregoing that the operation of the circuit provides a long squelch tail for low signal levels just above a minimum threshold and for slowly fading signals. On the other hand, when a relatively strong or high-signal level above a higher threshold is attained, the circuit reverts to a short squelch tail mode of operation under the control of the short time constant filter circuit provided by the noise detector filter capacitor 18. If the signal then rapidly drops from a high level to a no signal condition, the operation of the shunt switches 111 and 112 is almost immediate, with reproduction of the annoying "squelch tail" being prevented in the audio portion of the radio receiver.

It is desirable to use the dual time constant squelch circuit shown in FIG. 2 in conjunction with a radio receiver employing tone-coded squelch in addition to the squelch circuit shown in FIG. 2. In conjunction with the operation of such a tone-coded squelch receiver, it sometimes is desirable to disable the dual time constant squelch circuit shown in FIG. 2 and to cause the squelching operation to be effected only under control of the tone-coded squelch. This can be accomplished by applying ground potential to a noise squelch inhibit terminal 130, which then forward biases the PNP-transistor 110 to conduction irrespective of the condition of operation of the comparator circuit 89. This in turn applies a forward bias potential through the isolating diode 114 to the bases of the audio shunt transistors 111 and 112 rendering them conductive to shunt the audio circuits of the receiver.

The tone-coded noise squelch circuit (not shown) of the receiver, however, is still operative; and the output of this circuit is applied to an input terminal 131. When the desired tone-coded signal is received, a positive potential is applied to the terminal 131 and to the base of an NPN-transistor 132 to render that transistor conductive to shunt the output of the PNP-transistor 110. This in turn drops the potential on the bases of the the shunt transistors 111 and 112, rendering them nonconductive so that the receiver is unsquelched.

It also may be desirable to control the squelching operation of the receiver either under control of the tone-coded squelch or the dual time constant squelch circuit shown in FIG. 2. This function can be accomplished by leaving the terminal 130 ungrounded and applying the tone-coded positive squelch output to the terminal 131 whenever the desired tone-coded signal is received. Then either the noise squelch processed by the comparator circuits 85, 87 and 89 or the tone-coded squelch applied to the terminal 131 will control the unsquelching of the receiver by rendering the transistors 111 and 112 nonconductive.

Since the radio receiver also is generally employed as part of a transmitter/receiver combination, it may be desirable to squelch the audio output of the receiver whenever transmission is taking place. Muting of the receiver during the transmit mode of operation of the audio is accomplished by applying a positive potential to a mute input terminal 135 and through an isolating diode 136 to the bases of the shunt transistor 111 and 112. This causes the shunt transistors 111 and 112 to be rendered conductive irrespective of the operation of the noise squelch circuitry or input signals applied to the terminal 131.

The diode 114 prevents the mute voltage applied to terminal 135 from being shunted by transistor 132.

The diode 136 isolates the internally generated switching currents of the circuit shown in FIG. 2 from the external circuits connected to the terminal 135. It should be noted that when a positive potential is applied to the mute input terminal 135, this is the dominant potential since the receiver is forced to squelch by rendering the transistors 111 and 112 conductive, irrespective of any other action of the remaining circuitry shown in FIG. 2.

I claim:

1. A squelch filter circuit operated in response to a detected noise voltage including in combination:

filter means having a particular time constant and adapted to receive the detected noise voltage, and having an output and being responsive to the detected noise voltage to develop a filtered noise voltage at said output;

first switch means having input means and an output and responsive to an input voltage greater than a first predetermined threshold to be actuated thereby;

means coupling said output of said filter means with said input means of said first switch means;

second switch means having an input and an output and responsive to an input voltage greater than a second predetermined threshold which is less than said first predetermined threshold to be actuated thereby;

means coupling said output of said filter means to said input of said second switch means;

charge storage means having a time constant greater than said particular time constant coupled with said output of the second switch means for storing a predetermined charge in response to actuation of said second switch means, said predetermined charge producing a voltage greater than said first predetermined threshold;

circuit means coupling said charge storage means with said input means of said first switch means;

third switch means having an input and an output and responsive to an input voltage greater than a predetermined threshold which is equal to or greater than said first predetermined threshold to be actuated thereby;

means coupling said filter means to said input of said third switch means; and means coupled to said output of said third switch means and responsive to actuation thereof for disabling said charge storage means.

2. The combination according to claim 1 wherein the predetermined threshold of said third switch means is greater than both said first and second predetermined thresholds.

3. The combination according to claim 2 further including resistor means coupling the output of said second switch means with said charge storage means for providing a predetermined time delay following actuation of said second switch means before said charge storage means stores said predetermined charge.

4. The combination according to claim 1 wherein the means responsive to actuation of said third switch means for disabling said charge storage means renders said charge storage means nonresponsive to actuation of said second switch means.

5. The combination according to claim 1 further including reference voltage means, wherein said first, second, and third switch means are comparator circuits, with the thresholds of said first, second and third comparator circuits being determined by reference voltages obtained from said reference voltage means.

6. The combination according to claim 5 wherein said comparator circuits are differential amplifier circuits.

7. The combination according to claim 6 wherein the predetermined threshold of said third differential amplifier circuit is greater than both of said first and second predetermined thresholds.

8. The combination according to claim 1 wherein said charge storage means includes storage capacitor means and first and second charging path means connected to said storage capacitor means, said first charging path means being enabled by actuation of said second switch means to couple said capacitor means with a source of charging potential, said second charging path means having at least a portion thereof different from said first charging path means and further having a higher impedance than said first charging path means, with said higher impedance being of such a value as to cause the discharge of said capacitor means through said second charging path means to have a time constant greater than said particular time constant, and wherein said means for disabling said charge storage means operates to disable said first charging path.

9. The combination according to claim 8 wherein said first charging path means includes an emitter follower circuit connected between said capacitor means and a source of reference potential and having an input, means connecting said output of said second switch means to said input of said emitter follower circuit for rendering the same conductive in response to actuation of said second switch means, and wherein said means responsive to actuation of said third switch means provides a signal coupled to said input of said emitter follower circuit for rendering the same nonconductive and nonresponsive to said second switch means.

10. The combination according to claim 9 wherein said first, second and third switch means each are transistor differential amplifiers operated as differential switch means and each having an input, wherein the predetermined thresholds are established by voltage reference means providing reference voltages to each of said first, second and third differential switch means respectively, the detected noise voltage being applied to an input of each of said first, second and third differential switch means to actuate the same whenever the reference voltage applied to the corresponding switch means is exceeded by the filtered noise voltage, actuation of said second differential switch means rendering said emitter follower circuit conductive to charge said capacitor means to the same predetermined voltage irrespective of the voltage applied to said input of said second differential switch means once the threshold voltage reference level thereof has been exceeded.

11. The combination according to claim 10 wherein said means for rendering said emitter follower circuit nonconductive includes normally nonconductive transistor means responsive to actuation of said third differential switch means for shunting said input of said emitter follower circuit thereby rendering it nonconductive and nonresponsive to the output of said second differential switch means to interrupt said first charging path means for said capacitor means.

12. A squelch filter circuit operated in response to a detected noise voltage including in combination:

filter means having a particular time constant and adapted to receive the detected noise voltage, and having an output and being responsive to the detected noise voltage to develop a filtered noise voltage at said output;

first switch means having an input and an output and responsive to an input voltage greater than a predetermined threshold to be actuated thereby;

means coupling said output of said filter means to said input of said first switch means;

charge storage means having a time constant greater than said particular time constant coupled with said output of said first switch means for storing a predetermined charge in response to actuation of said first switch means;

second switch means having input means and an output, with said input means coupled with said charge storage means for operating said second switch means in response to the predetermined charge;

means coupling said output of said filter means to said input means of said second switch means for controlling the same in response to a detected noise voltage which exceeds a second threshold greater than said predetermined threshold; and squelch control means connected to said output of said second switch means and controlled thereby.

13. The combination according to claim 12 wherein said charge storage means includes storage capacitor means and first and second charging path means connected to said storage capacitor means, said first charging path means being enabled by actuation of said first switch means to couple said storage capacitor means with a source of charging potential, said second charging path means having at least a portion thereof different from said first charging path means and further having a higher impedance than said first charging path means, with said higher impedance being of such a value as to cause the discharge of said storage capacitor means through said second charging path means to have a time constant greater than said particular time constant.

14. The combination according to claim 13 wherein said first charging path means includes an emitter follower connected between said storage capacitor means and a source of reference potential, said emitter follower being rendered conductive in response to actuation of said first switch means.

15. The combination according to claim 1 further including squelch control means connected to said output of said first switch means.

16. A squelch filter circuit operated in response to a detected noise voltage including in combination:

filter means adapted to receive the detected noise voltage having a particular time constant and having an output, and being responsive to the detected noise voltage to develop a filtered noise voltage at said output;

first comparator means having input means and an output and responsive to an input voltage greater than a first predetermined threshold to be actuated thereby;

means coupling said output of said filter means with said input means of said first comparator means;

second comparator means having an input and an output and responsive to an input voltage greater than a second predetermined threshold which is less than said first predetermined threshold to be actuated thereby;

means coupling said output of said filter means to said input of said second comparator means;

charge storage means having a time constant greater than said particular time constant coupled with said output of the second comparator means for storing a predetermined charge in response to actuation of said second comparator means, said predetermined charge producing a voltage greater than said first predetermined threshold;

circuit means coupling said charge storage means with said input means of said first comparator means;

control means having an input and an output with said input coupled to said filter means for receiving the filtered noise voltage; and means coupling said output of said control means to said charge storage means for controlling the same in response to the filtered noise voltage.

* * * * *